United States Patent [19]

Nishizawa

[11] Patent Number: 4,619,718

[45] Date of Patent: Oct. 28, 1986

[54] METHOD OF MANUFACTURING A GROUP II–VI SEMICONDUCTOR DEVICE HAVING A PN JUNCTION

[76] Inventor: Jun-ichi Nishizawa, No. 6-16, Komegafukuro 1-chome, Sendai-shi, Miyagi-ken, Japan

[21] Appl. No.: 628,974

[22] Filed: Jul. 10, 1984

Related U.S. Application Data

[63] Continuation-in-part of Ser. No. 266,042, May 21, 1981, abandoned.

[30] Foreign Application Priority Data

Jun. 12, 1980 [JP] Japan .................................. 55-79805

[51] Int. Cl.[4] .................. H01L 21/368; H01L 21/383; H01L 21/388
[52] U.S. Cl. ..................................... 148/171; 148/172; 148/186; 148/189; 29/569 L; 156/616 R
[58] Field of Search ............... 148/171, 172, 186, 187, 148/188, 189; 29/569 L; 156/DIG. 77, 616 R

[56] References Cited

U.S. PATENT DOCUMENTS

| | | | |
|---|---|---|---|
| 3,615,877 | 10/1971 | Yamashita | 148/186 X |
| 3,870,473 | 3/1975 | Kyle | 423/509 X |
| 4,190,486 | 2/1980 | Kyle | 148/171 X |
| 4,389,256 | 6/1983 | Nishizawa et al. | 148/1.5 |
| 4,465,527 | 8/1984 | Nishizawa | 29/569 L |
| 4,526,632 | 7/1985 | Nishizawa | 148/172 X |

FOREIGN PATENT DOCUMENTS 49-99266 9/1974 Japan .
55-25159 7/1980 Japan .

OTHER PUBLICATIONS

Jun-ichi Nishizawa et al., Effects of Vapor Pressure on GaP LED's *Japanese Journal of Applied Physics*, vol. 17 (1978), Supplement 17-1, pp. 87–92.

Washiyama et al., *Electronic Materials EFM-78-12*, The Institute of Electrical Engineers of Japan, Tokyo, Japan, Nov. 29, 1978, pp. 1–9.

Nishizawa et al., *Journal of Crystal Growth*, vol. 31 (1975), pp. 215–222.

*Primary Examiner*—George T. Ozaki
*Attorney, Agent, or Firm*—Cushman, Darby & Cushman

[57] ABSTRACT

A method of manufacturing a semiconductor device by the use of a Group II–VI compound semiconductor crystal prepared by liquid growth method using a temperature difference technique under controlled vapor pressure of the crystal-constituting Group VI element. Thus, the concentration of vacancies and other defects acting as donor is reduced as compared with the concentration of the p type impurity to be introduced. This invention is suitable for producing light-emitting diodes emitting a light of short-wave lengths.

7 Claims, 3 Drawing Figures

METHOD OF MANUFACTURING A GROUP II-VI SEMICONDUCTOR DEVICE HAVING A PN JUNCTION

This is a continuation-in-part of application Ser. No. 266,042, filed May 21, 1981, now abandoned.

BACKGROUND OF THE INVENTION

1. Field of the Invention

The present invention concerns a semiconductor device and the manufacturing method therefor, and more particularly it pertains to pn junction semiconductor devices using Group II-VI compound semiconductors and the manufacturing method therefor.

2. Description of the Prior Art

Research and developments in respect of pn junction light-emitting diodes (LEDs) using various kinds of semiconductor materials are under way at present. The wavelengths of light produced by conventional LEDs range roughly from infrared region to green color in the visible region. Some of their examples are as follows.

LEDS made of GaAs having an energy band gap of about 1.43 eV emit light in the infrared region having a peak intensity at about 9100 Å. GaP LEDs (not doped with nitrogen (N)) emit light of green color having a peak intensity at 5500 Å, while GaP LEDs which contain nitrogen emit yellow color light having its peak intensity at about 5800 Å. Also, in mixed crystals formed of $Ga_{1-x}Al_xAs$ it is known that, by varying the component ratio x, LEDs emitting red color light having a peak intensity of about 6500 Å are obtained.

The wavelength for light emission at peak intensity appears in a wavelength region longer than the absorption edge of the semiconductor. The wavelength λ of the absorption edge, which is the shortest wavelength possible for emission, is expressed by:

$$\lambda = \frac{hc}{E_g} \approx \frac{1.24}{E_g(eV)} \; (\mu m)$$

wherein:
- h represents Planck's constant;
- c represents velocity of light; and
- $E_g$ represents energy band gap of the semiconductor material expressed by eV.

The wavelengths of emitting lights of known LEDs extend up to about 5500 Å (green color). No LEDs have previously been provided which emit light having a higher energy than that mentioned above, (i.e., a light of a shorter wavelength blue-green, blue and violet color), although there is a strong demand for such LED's.

As discussed above, in order to obtain an LED which emits light in the blue-green, blue and violet region, it is necessary to use semiconductor materials having an energy band gap broader than that of Group III-V compound semiconductors such as GaAs, GaP or $Ga_{1-x}Al_xAs$. As such semiconductors, there are Group II-VI compound semiconductors such as ZnSe($E_g \approx 2.8$ eV). These semiconductors have broad energy band gaps, and have therefore attracted the interest of researchers. Nevertheless, owing to various technical problems, they have not yet been put to practice. The Group II-VI compound semiconductors such as ZnSe stated above have a broad energy band gap, and, for some time, crystals have been produced either as a photo-conductive semiconductor or as an electroluminescent semiconductor. As is well known, however, there has been technical difficulty in achieving free control of the conductivity types of Group II-VI compound semiconductors. Table 1 shows the conductivity type and energy band gap of Group II-VI compound semiconductors which have been obtained in the past.

TABLE 1

|  | ZnS | ZnSe | ZnTe | CdS | CdSe | CdTe |
|---|---|---|---|---|---|---|
| Conductivity | n | n | p | n | n | n<br>p |
| Energy band gap | 3.6 eV | 2.8 eV | 2.2 eV | 2.5 eV | 1.74 eV | 1.5 eV |

The semiconductor materials listed in Table 1 invariably have a broad energy band gap, and will bring about a very effective result if LEDs are manufactured with them. As stated above, however, free control of the conductivity type of such compounds has not been practicable. For ZnS, CdS or ZnSe a n-type conductivity is easily obtained. However, even doping an acceptor impurity in an attempt to obtain a p type material results in the doped materials remaining an n type or in a p-type material having a very high resistivity. Even when the material happens to become p type, its control is so difficult that the formation of a pn junction necessary for an LED has not been possible.

SUMMARY OF THE INVENTION

It is an object of the present invention to provide a semiconductor device having a desirable single crystal pn junction using Group II-VI compound semiconductors, by improving the physical manufacturing conditions which would bring about the above-stated undesirable result, and also to provide a method of manufacturing such a semiconductor device.

Another object of the present invention is to provide a pn junction semiconductor device which is capable of emitting light of blue color region by the use of a ZnSe crystal, and a manufacturing method of the same.

DETAILED DESCRIPTION OF THE PREFERRED EMBODIMENTS

Figure 1:
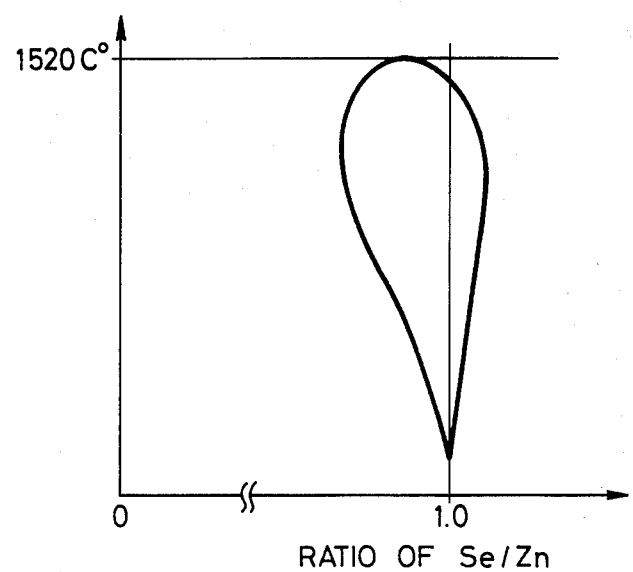
FIG. 1 is a schematic diagram showing the relationship between the range of deviation from stoichiometry of a ZnSe crystal and the growth temperature.

Hereunder will be stated the reason why, in Group II-VI compound semiconductors such as ZnSe and CdS, one of the conductivity types can be easily formed, whereas the other conductivity type can not be formed (except with so high a resistivity as to be close to an insulator), and the reason why a pn junction has not been practically obtained.

Because Group III-V compound semiconductors and Group II-VI compound semiconductors are comprised of two elements, these compound semiconductors have physical problems which are not encountered in elemental semiconductors like silicon.

Among the problems, the most important is the deviation from stoichiometry of the crystals. That is, in compound semiconductors which are comprised of two elements, the desirable composition ratio of the two elements is perfectly 1:1. In an actual crystal, however, a large number of vacancies or interstitial atoms are produced during the growth of the crystal, resulting in a deviation from the proportion of 1:1. Formation of a semiconductor crystal invariably entails a heating step. In semiconductors such as Group II–VI or III–V compound semiconductors which are comprised of two elements, the vapor pressure of the Group VI element is much higher than that of the Group II element. Therefore, when a crystal is produced, there will be a large deviation from stoichiometry. This deviation from stoichiometry occurs similarly in Group III–V compound semiconductors. However, in Group II–VI compound semiconductors, the deviation from stoichiometry will more intensively and more complicatedly influence the conductivity type or impurity concentration. For example, in such semiconductors as ZnSe and CdS, it should be noted that Se and S have higher vapor pressures as compared with Zn and Cd. Therefore, in these crystals, there exist a number of vacancies of S sites and Se sites which serve to function as donors. It is difficult to make a p type region from these crystals by doping an acceptor impurity because the vacancies of S or Se acting as donors compensate for the acceptor. Accordingly, the resulting crystal tends to become a high-resistivity crystal. Such phenomenon is known as the self-compensation effect.

The "temperature difference method under controlled vapor pressure" for single crystal growth was in general disclosed in, for example, Japanese Patent Application laid open Sept. 14, 1979 as No. Sho 49-99266. No. Sho 48-11416 by the present inventor, was first applied to Group III–V compound semiconductors and was found to be very effective. It has been found that this method can be effectively applied to the single crystal growth of Group II–VI compound semiconductors (Japanese Patent Application, No. Sho 55-78620 filed on June 11, 1980 entitled "a method of growing crystal of Group II–VI compound semiconductors" proposed by the present inventor). Also, in the case that the ZnSe is grown by relying on, for example, as known growth technique, a considerably high growth temperature is required. In this method, a single crystal of a compound semiconductor is grown from the melt which is constituted of the component elements. The melt composition is usually nonstoichiometric so that the growth temperature is much lower than the melting temperature of the crystal. A temperature difference is formed in the melt to cause the diffusion of source materials to the seed or substrate single crystal, while the temperature of each portion of the melt is held constant during the growth. A constant vapor pressure of the volatile component element is applied onto the melt during the growth, as is clear from the above-mentioned references. In the reference, it is mentioned that the growth is due to the constant flow of the solute materials from the high-temperature portion of the melt where the source materials are placed to the substrate held at the low-temperature portion of the melt, so that the thickness of the grown layer proportionally increases with an increase in the growth time despite the fact that the temperatures of the portions of the melt are held constant. This is different from usual slow-cooling liquid-phase growth where a growth occurs due to the supersaturation of the melt as a result of the temperature-lowering so that the amount of deposition is limited by the solubility at the starting temperature. It is also mentioned in the references that the vapor pressure is applied upon the melt, not directly on the substrate or the seed. This is very different from the usual heat-treatment under the vapor pressure where the vapor is applied directly upon the solid phase. In the usual crystal growth method of ZnSe, a relatively high growth temperature is required. In the case of growth at the melting point, the temperature is usually 1520° C., and in the case of vapor transport growth, it is usually 1000° C. or higher. By relying on the temperature difference method under controlled vapor pressure, or even lower however, crystals of sufficiently high quality can be grown at a temperature ranging from 900° to 950° C. Thus, deviation from stoichiometry due to vaporization of such Group VI element as Se or S can be remarkably suppressed.

That is, as shown in FIG. 1, the amount of the crystal's deviation from stoichiometry, $\delta$, is remarkably reduced as the growth temperature becomes lower as expressed by:

$$\delta = A \exp(-E/kT)$$

wherein:
A represents a constant;
k represents a Boltzmann constant;
T represents an absolute temperature °K.; and
E represents the energy for forming a vacancy.

The reduction of $\delta$ means a reduction of the density of vacancies of Se or S. Moreover, according to the liquid-phase crystal growth method under controlled vapor pressure, it is possible to arbitrarily control the applied vapor pressure applied on the melt. Accordingly, by the application of the temperature difference method growth under controlled vapor pressure, it becomes possible to suppress the self-compensation effect due to the generation of vacancies of S or Se, and to thereby form a desirable pn junction of Group II–VI compound semiconductors.

EXAMPLE 1

An n type ZnSe crystal which has been grown under controlled vapor pressure of Se is used as the substrate which may contain about 1 percent of Te. The manufacture of this substrate cyrstal requires to be performed under the following conditions. That is, the vapor pressure during the growth of said crystal is required to be held constant at a relatively high value, and the growth is required to be carried out at as low a temperature as possible (that is, a temperature lower than the melting temperature of ZnSe), in order to insure that the deviation from stoichiometry is suppressed to as small a value as possible. When an acceptor impurity is doped in the subsequent manufacturing of pn junctions, any large generation of vacancies due to self-compensation can be avoided, if such crystals are used as substrates. The growth temperature of the substrate crystal is set at 1000° C. or lower, desirably 950° C. or lower, and the vapor pressure is set at 1 Torr or higher, desirably $10^2$ Torr or higher. In the manufacturing process of pn junctions, it is necessary to perform the diffusion of a p type impurity at as low a temperature as possible in order to suppress the generation of Se vacancies which act as the donors. However, the concentration of the diffused acceptor impurity cannot be made sufficiently large because the diffusion temperature is low. The impurity concentration usually is of the order of $10^{17}$ cm$^{-3}$ or lower. In order that the diffused region can be converted to a p-type conductivity, the substrate crystal should be grown at as low a temperature as possible and under a high Se vapor pressure in order to reduce the vacancy concentration less than the concentration of the diffused p type impurity. To fabricate pn junctions, the grown substrate crystal is enclosed in a vacuum or an inert gas atmosphere such as argon in a quartz tube, followed by a diffusion of an acceptor impurity during as short a period of time as possible at a temperature, within the range of about 300° C. to 600° C., which is relatively low ordinary diffusion temperature. In order to form a pn junction by diffusing an impurity at such low temperatures, it is necessary to select the impurity from among those having a large diffusion coefficient. For example, gold as an acceptor diffuses quickly at a low temperature. It takes about 3 minutes to diffuse the impurity atoms of gold to a depth of 1 $\mu$m at 300° C.–400° C. Also, silver diffuses quickly, and it takes only about minute or less to diffuse to a depth of 1 $\mu$m.

As stated above, the diffusion of gold or silver can be performed at a remarkably low temperature and with large diffusion coefficient. The diffusion of gold or silver can be accomplished during a period less than 1 hour at most. Diffusion coefficients of these impurities are larger than that of the Se vacancy which is generated due to vaporization of Se during the diffusing step. Because of the fact that the diffusion is done through the use of such an impurity as mentioned above and at a low temperature and for a short period of time, it becomes possible to reduce the generation of vacancies and to obtain a p type region.

Figure 2:
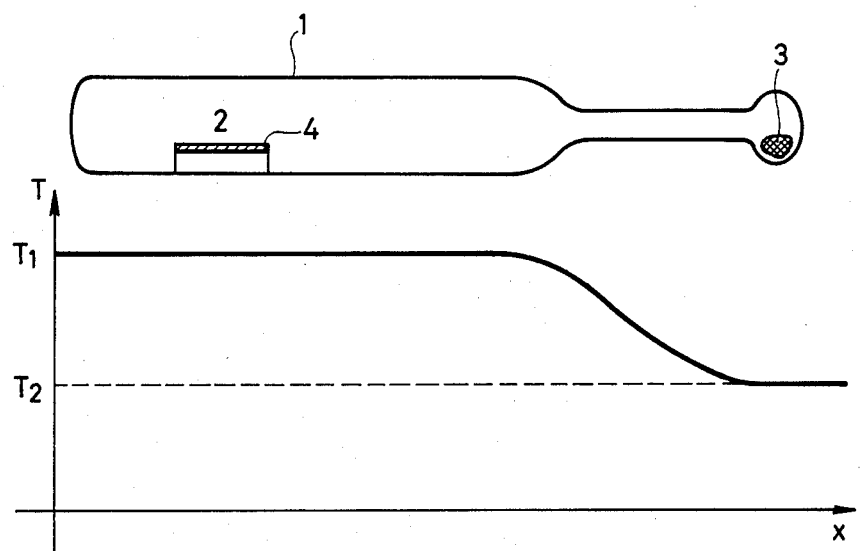
FIG. 2 is a diagram showing the method of diffusing gold as an impurity into a substrate crystal.

However, if an ordinary ZnSe crystal which has not experienced the control of vapor pressure is used as a substrate, a larger number of donor vacancies are generated from the beginning of diffusion, making the formation of a pn junction difficult. If the diffusion of an impurity is performed in vacuum in place of an inert gas such as argon, vaporized molecules of Se escape from the crystal during the diffusing step. Therefore, the diffusion is performed in accordance with such a diffusion system as shown in an example in FIG. 2. A crystal substrate 2 deposited with an impurity source 4 such as a gold, and a metal Se which is indicated by numeral 3 are enclosed separately from each other in a quartz tube 1 filled with an inert gas such as argon. This quartz tube is placed in two different temperature zones, and diffusion is performed. The temperature $T_1$ in the zone in which the crystal substrate is placed and the temperature $T_2$ in the zone containing the metal Se are independently controlled. Since the vapor pressure of Se as a function of temperature is known, the temperature $T_2$ can be determined to provide a required vapor pressure. The Se pressure, and accordingly $T_2$ desirably should be as high as possible. If $T_2$ is higher than $T_1$, an excessive transportation of Se into the first zone would occur. It should be noted, however, that, as far as the diffusion time is short enough to insure that an amount of transport of Se is not large, the relation $T_2 < T_1$ is not always necessary. In many practices, it is desirable to perform the diffusion of gold or silver at $T_2$ slightly less than $T_1$, such as $T_1 = 350°$ C. and $T_2 = 330°$ C. The Se vapor pressure need be at least 0.1 Torr or higher. In the above-mentioned Example, the Se vapor pressure is about 0.5 Torr. During the heat treatment step, the deviation from stoichiometry, i.e. the generation of Se vacancies, is extremely mitigated. Also, self-compensation hardly occurs.

The self-compensation is interpreted as follows. In ordinary cases, when an impurity which serves as an acceptor is doped, the free energy of the crystal as a whole will become high due to the presence of holes which have been captured by the acceptors. Accordingly, under the condition allowing the generation of those vacancies of a Group VI element, namely, without Se vapor pressure, the acceptor impurity is compensated for by the generated vacancies, because the generation of vacancies decreases the free energy of the crystal as a whole. Therefore, vacancies are generated in proportion to the amount of the doped acceptor impurity, and thus the crystal will not either become a p type or will become highly resistive.

However, if Se vapor is applied constantly onto the crystal during the diffusion step, the vacancy concentration will remain substantially constant, in spite of the presence of acceptor impurity, and moreover this vacancy concentration in the starting substrate is very small. Thus, little self-compensation takes place. Unless the growth of the substrate crystal is done under a controlled vapor pressure, the crystal is difficult to be made p type by the diffusion process. The impurity diffusion with application of a vapor pressure of the element constituting the semiconductor crystal is already known. According to this known technique, however, a pn junction of ZnSe has not been obtained. The reason is as follows. Because the vapor pressure control method is not used during the growth of crystal and growth temperature is too high, substrate crystal that contains a remarkably high concentration of vacancies are obtained. Thus, during the process of subsequent diffusion of an impurity, the vapor pressure control is not sufficient for a reduction of vacancies, and in addition, the diffusion time is too short for the reduction of vacancies.

The energy band gap $E_g$ of ZnSe at room temperature is about 2.80 eV. On the other hand, the range of wavelengths from blue-green to violet color is 5500 Å–4500 Å. It corresponds to the photon energies of the range of 2.25 eV–2.75 eV. Therefore, where the transition between the $E_D$ conduction band and the acceptor level dominates, the appropriate depth of the acceptor level is 0.55–0.05 eV as measured from the valence band to obtain 5500 Å–4500 Å color, whereas where the transition between the donor level and the acceptor level dominates, a depth of the acceptor level 0.4–0.02 eV is appropriate because the donor level $E_p$ of the ZnSe crystal is about 0.03 eV–0.2 eV. Therefore, the acceptor level of an impurity which gives a p type conductivity is required to have a value of about 0.5 eV or lower as measured from the valence band. Moreover, it should be noted that, with the acceptor level of 0.5 eV, the ionization of positive holes at room temperature is too little. Thus, in order to give a good electric conduction, in general, the acceptor level should be shallow, and the adoption of such impurity as having a level of 0.2 eV or lower is more appropriate.

The characteristic of gold impurity has essentially not been known in the past. However, in view of the finding that a pn junction LED having a blue color light emission band has been successfully obtained, gold seems to have an acceptor level of 0.2 eV or lower. Some impurities whose acceptor levels are known for ZnSe crystal are shown in Table 2. Silver can also be used for the formation of a pn junction. Attention has to be paid, however, to the fact that silver is known to form another deep level of about 0.5 eV.

TABLE 2

| Impurity | Au | Ag | Cu | [Mg] | P | As | Sb |
|---|---|---|---|---|---|---|---|
| Acceptor level (eV) | 0.2 | 0.15 | 0.5 | 0.68 | 0.7 | 0.7 | |

Notes: The elements P, As and Sb which are Group V elements usually constitute donor levels in silicon, but they form acceptor levels in ZnSe cyrstals.

Even when an impurity diffusion is performed under a controlled vapor pressure, evaporation of Se will take place to some extent when the vapor pressure is not sufficiently high. Such evaporation of Se can be if minimizing the diffusing velocity of the impurity is sufficiently greater than the diffusion velocity of the Se vacancies which have been located near the surface region of the crystal, and if the impurity diffusion is completed during a short period of time.

Gold is preferable as such impurity.

EXAMPLE 2

Figure 3:
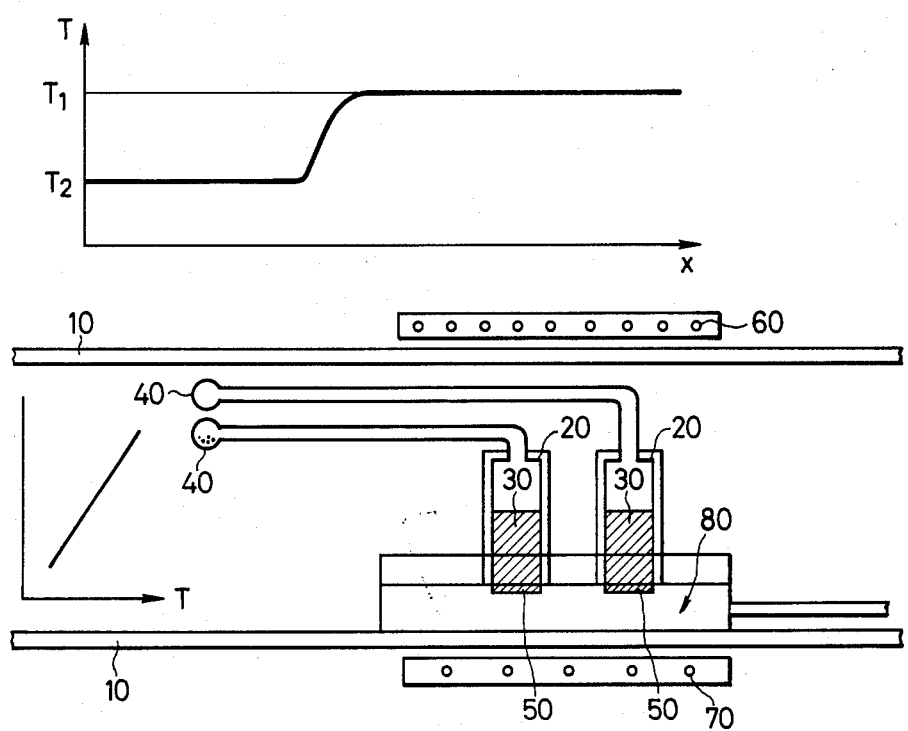
FIG. 3 is a schematic diagram showing the method of manufacturing a pn junction ZnSe by relying on the epitaxial growth technique.

An n-type ZnSe substrate crystal which has been grown under a controlled vapor pressure is used. A growth layer of p type ZnSe is formed, by relying on the epitaxial growth technique, on the substrate under an Se vapor pressure. This epitaxial growth method adopts liquid phase growth and employs an apparatus similar to the controlled vapor pressure type epitaxial growth apparatus which is used for Group III-V compound semiconductors. An example thereof is shown in FIG. 3.

On a slider 10 made of carbon and housed within a quartz tube partially shown are placed said substrates 50, 50. In the melt bath vessels 20, 20 are placed batches of a mixed melt metal of ZnTe. The top of each melt bath vessel 20 is covered with a lid to provide gas-tightness of the vessel, and the ratio of Te, Zn and Se of the mixed melt metal is set at a desired value. In FIG. 3, the vessels 40, 40 are connected to the two melt bath vessels through their quartz tubes, respectively, and provide a predetermined Se vapor pressure from Se heated at a temperature $T_2$. And also, at the outside of quartz tube 10 and at sites sandwiching therebetween the mixed melt metal bath vessels 20 and 20 and also the substrates 50 and 50, there are provided an upper heater 60 and a lower heater 70. The temperature of the upper heater 60 is set to be higher than that of the lower heater 70. Thus, liquid-phase crystal growth is accomplished by virtue of the temperature differences produced.

Since this mixed metal contains Se, and since this example relies on the temperature difference method, the liquid phase growth can be accomplished at a temperature less than 1000° C. Moreover, because the segregation coefficient of Te into the crystal is very small and the Te content in the grown layer can be 1% or less.

Doping impurities such as gold, silver or phosphorus are listed in Table 2. It is desirable from the viewpoint of the pn junction characteristics to carry out the growth thereof at a temperature ranging from 800° to 400° C., which is much lower than 950° to 900° C. which are known examples of temperatures for growing a substrate crystal. The concentrations of Se vacancies or its complexes with impurities are lowered because the temperature in the present invention is very low. Thus, a diode which emits blue or green light can be obtained.

The above-described method of forming pn junction can be applied equally effectively to ZnS, CdS and CdSe, other than ZnSe. CdS has a band gap of 2.5 eV. Thus, it is suitable as an LED emitting a green or yellow light, if the energy value of acceptor level is subtracted from the value of the energy band gap.

Those acceptor impurities of Group II-VI compound semiconductors could form two or more acceptor levels such as silver shown in Table 2 for ZnSe. In such an instance, not only can there be a transition of emitting a blue color light, but also there can be the concurrent transition of emitting a red or yellow color light. Even in such a case, an emission of an almost pure blue light can be obtained by the inclusion of a substance such as $Fe_2O_3$, which absorbs the light in the red and yellow band, in the epoxy resin which covers the LED.

What is claimed is:

1. A method of manufacturing a semiconductor device having a pn junction formed in a Group II-VI compound semiconductor crystal, comprising:
   preparing an n-type Group II-VI compound semiconductor crystal by the temperature difference method under controlled vapor pressure of the crystal-constituting Group VI element from a melt that contains constituting elements; and
   forming a p type semiconductor region on top of said n-type semiconductor region by an epitaxial growth technique using a temperature difference method under controlled vapor pressure of said crystal-constituting Group VI element from a melt that contains essentially constituting elements of the crystal and an impurity having a p type conductivity.

2. A method according to claim 1, wherein the Group II-VI compound is ZnSe.

3. A method of manufacturing a semiconductor device having a single crystal region with a PN junction formed in a Group II-VI compound semiconductor crystal wherein, by depending upon only a doping of an impurity, it is difficult to control the conductivity type of said single crystal region, comprising:
   growing a Group II-VI compound semiconductor crystal substrate having a first conductivity type obtained by a liquid-phase growth process under controlled vapor pressure, not lower than 1 Torr, of the crystal-constituting element and at a growth temperature lower than a melting temperature of the crystal, without relying on a lowering of the growth temperature during the growth process, in order to minimize deviation from stoichiometry; and
   forming on said semiconductor crystal a semiconductor region of a second conductivity type opposite to said first conductivity type by diffusing an impurity of the second conductivity type into said Group II-VI compound semiconductor crystal in a closed tube under a predetermined vapor pressure at a level not lower than 0.1 Torr of the crystal constituting Group VI element.

4. A method according to claim 3, wherein said impurity is one having a diffusion coefficient greater than that of vacancy produced in said crystal during doping of said impurity, by diffusion, into said crystal.

5. A method according to claim 4, wherein the prepared Group II-VI compound semiconductor crystal is made of an n-type ZnSe, containing 1 percent or less of Te, the vapor is that of Se, and the impurity of a second conductivity type is p type.

6. A method according to claim 5, wherein the diffusion of the impurity is conducted at a temperature lower than 600° C. under a vapor pressure of 0.1 Torr or more of the crystal-constituting Group VI element in the closed system, and said impurity is selected from the group consisting of gold and silver.

7. A method according to claim 6, wherein the diffusion of gold is conducted at a temperature ranging from 400° C. to 300° C.

* * * * *